United States Patent [19]

Shibata et al.

[11] Patent Number: 5,391,409
[45] Date of Patent: Feb. 21, 1995

[54] LOW TEMPERATURE METHOD FOR SYNTHESIZING DIAMOND WITH HIGH QUALITY BY VAPOR PHASE DEPOSITION

[75] Inventors: Takayuki Shibata, Otaru; Nobuhiro Ota; Naoji Fujimori, both of Hyogo, all of Japan

[73] Assignee: Sumitomo Electric Industries, Ltd., Osaka, Japan

[21] Appl. No.: 861,540

[22] Filed: Apr. 1, 1992

[30] Foreign Application Priority Data

Apr. 1, 1991 [JP] Japan .................. 3-096367

[51] Int. Cl.$^6$ .................. B05D 3/06; C23C 16/26
[52] U.S. Cl. .................. 427/577; 427/249; 427/255.1
[58] Field of Search .................. 427/249, 255.1, 577; 156/DIG. 68; 428/408; 423/446

[56] References Cited

U.S. PATENT DOCUMENTS

| | | | |
|---|---|---|---|
| 4,957,061 | 9/1990 | Ando et al. | 427/255.7 |
| 5,009,923 | 4/1991 | Ogata et al. | 427/38 |
| 5,071,677 | 12/1991 | Patterson et al. | 427/249 |
| 5,094,878 | 3/1992 | Yamamoto et al. | 427/37 |

FOREIGN PATENT DOCUMENTS

| | | |
|---|---|---|
| 0348026 | 4/1988 | European Pat. Off. . |
| 0284190 | 9/1988 | European Pat. Off. . |
| 59-30709 | 2/1984 | Japan . |
| 333641 | 5/1991 | Japan . |

OTHER PUBLICATIONS

The Condensed Chemical Dictionary 10th edition; Van Nostrand Reinhold Company 1981 p. 856.
Schuegraf, K. K., Handbook of Thin-Film Deposition Processes and Techniques; Noyes Publications 1988 p. 81.
Patterson et al., "Halogen-Assisted Chemical Vapor Deposition of Diamond", disclosed at Second International Conference New Diamond Science and Technology held in Washington, D.C. from Sep. 8–Sep 17, 1990.

*Primary Examiner*—Shrive Beck
*Assistant Examiner*—Bret Chen
*Attorney, Agent, or Firm*—Cushman Darby & Cushman

[57] ABSTRACT

A diamond film deposited on a substrate heated at less than 400° C. in vapor phase from material gas including hydrogen gas and hydrocarbon gas often incurs low strength, low abrasion resistance, and opacity owing to high concentration of non-diamond ingredients. The inventors have discovered that inclusion of nitrogen gas in material gas is likely to raise the concentration of non-diamond ingredients. Good diamond film of good quality shall be obtained by synthesizing from the material gas in which the nitrogen concentration is less than 1000 ppm. The smaller the nitrogen concentration is suppressed, the higher the quality of diamond rises.

13 Claims, No Drawings

LOW TEMPERATURE METHOD FOR SYNTHESIZING DIAMOND WITH HIGH QUALITY BY VAPOR PHASE DEPOSITION

FIELD OF THE INVENTION

This invention relates to a method for synthesizing diamond by vapor phase deposition, especially to a low temperature method for synthesizing diamond with high quality nearly immune from non-diamond ingredients, e.g. graphite amorphous carbon, etc.

BACKGROUND OF THE INVENTION

Diamond has high hardness, high abrasion resistance, high compressibility and low heat expansion. Although it is an insulator, diamond has very high heat conductivity. With high refractive index diamond is transparent to ultraviolet light, visible light and infrared light. It excels in chemical resistance and in propagation velocity of sound waves. Although diamond is inherently an insulator, it can be converted to a p-type semiconductor or an n-type semiconductor by doping. Thus, applications of diamond have been intensively contrived in various fields of technologies. Diamond is a very important material in present industries.

Bulk diamond can be synthesized by the ultrahigh pressure method. Film diamond is synthesized by a microwave plasma chemical vapor deposition (CVD) method, or a thermal filament CVD method, etc. from a vapor phase consisting of the mixture gas including hydrocarbon gas and hydrogen gas. Film diamond has excellent characteristics similar to bulk diamond. Thus, film diamond has also developing the scope of the applications.

The body on which diamond films are deposited is called a substrate body. A substrate may mean a plate, i.e. two dimensional body in general. In this invention, a substrate shall include a three dimensional body besides a plate as a base body of deposition. The conventional vapor deposition methods required heating the substrate body up to 700° C.–1000° C. Accordingly, the material of the substrate body has been restricted to materials with high heat resistance. For example, diamond, molybdenum, silicon or other refractory materials are used as substrate bodies in the conventional CVD methods of diamond.

However, the vapor phase deposition of diamond films has recently been investigated intensively. Some researchers have reported that diamond can be synthesized at as low as 400° C. Such low temperature synthesis of diamond has made it possible to use a greater array of materials for the substrate body. Although diamond can be produced at low temperature of 300° C., such a low temperature deposition is insufficient to produce diamond films of high quality with high yield. Low temperature synthesis of diamond which can produce diamond of high quality with high yield is strongly desired. In order to lower the temperature of synthesis, adding halogen gas to material gas has been proposed. Halogen gas means chloride gas, fluoride gas, bromide gas and compound gas including halogen.

The low temperature synthesis still has drawbacks. First, the growing speed of film diamond is very slow. Second, the diamond synthesized by the low temperature method, for example at temperatures as low as 400° C. is often accompanied by nonhomogeneous opaque parts. The diamond is inferior in strength or abrasion resistance to the diamond produced at high temperature. Low yield and low quality are fatal drawbacks of the present low temperature method of diamond synthesis. Opacity, weak strength or low abrasion resistance originates from the inclusion of non-diamond ingredients; e.g. amorphous carbon or graphite included in the diamond grown at low temperature.

The reason why so much non-diamond ingredients are generated in the diamond grown at low temperature has not been understood yet. Even if the conditions for synthesis are all the same; e.g. components of gases, temperature of substrate and pressure for deposition, the fluctuation of the quality of the diamond films were so large that the products using the diamond films were of bad quality. The purpose of the invention is to provide a method for producing diamond of high quality which includes little non-diamond ingredients; e.g. amorphous carbon or graphite by clarifying the reason why the non-diamond ingredients are generated in the low temperature CVD.

Japanese patent publication NO. 3-33641 (33641/91) has proposed a method for producing carbon films by ionizing material gas including halogen atoms, hydrogen atoms and carbon atoms. The material gas is introduced into a reactor and ionized by glow discharge, arc discharge, plasma jet etc. A substrate installed in the reactor has been heated at 200° C. to 900° C. The pressure is reduced to several tens of retort ($10^{-3}$ Torr) to several tens of Torr. The carbon films have at least as a short range order a tetrahedral structure like diamond crystal. Doping of halogen atoms is important. The inventors told that the role of the halogen is to ionize or radicalize hydrocarbon or halogenized carbon in the reaction under plasma atmosphere. Such a reaction

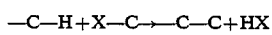

will occur at the surface of the carbon films by the action of halogen. This invention has succeeded in synthesizing diamond-like carbon films at pressures below several tens of Torr which had been the lowest pressure for vapor phase deposition of diamond like films. The lower the pressure is, the lower the impurity concentration becomes. Halogen doping enabled the inventors of 33641/91 to grow amorphous carbon films at low pressure e.g. hundreds of mTorr.

Donald E. Patterson et al have proposed a method for growing diamond films using halogen.

DONALD E. PATTERSON, BENJAMIN J. BAY, C. JUDITH CHU, ROBERT H. HAUGE, AND JOHN L. MARGRAVE, "HALOGEN-ASSISTED CHEMICAL VAPOR DEPOSITION OF DIAMOND", SECOND INTERNATIONAL CONFERENCE, WASHINGTON, D.C. USA, SEP. 23-27, 1990, pp433–438.

The conventional CVD method had used a substrate heated up to 700°-900° C. for growing diamond in vapor phase. But Patterson et al have asserted their method can grow diamond films on a substrate heated even at 250° C. The role of halogen is to facilitate the formation of diamond because of large decrease of Gibb's free energy In the reaction from methane and fluoride to carbon (solid) and hydrofluoric acid. Then, halogen deprives the film of graphite by the following reaction

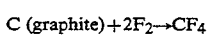

Halogen doping to material gas is effective to lower the temperature of the substrate. Therefore, the method using material gas including halogen has been known. Although the material gas including halogen is used for synthesizing diamond at low temperature, the method is not still so capable for reducing concentration of non-diamond ingredients. Many diamond films which have been grown on a substrate body kept below 400° C. contain large amount of non-diamond ingredients. Such non-diamond ingredients deteriorate the quality of diamond films, e.g. opacity, low abrasion resistance, low growing speed and low strength.

SUMMARY OF THE INVENTION

The inventors have been intensively searching the ground why non-diamond ingredients are borne in low temperature CVD synthesis of diamond. Finally, they have discovered that inclusion of nitrogen causes the occurrence of non-diamond ingredients. They have noticed that the concentration of nitrogen in material gas should be suppressed below 1000ppm in order to produce diamond films with little concentration of non-diamond ingredients. Of course, such a material gas which includes no nitrogen at all would be the most preferable. However, it is now impossible to exclude nitrogen from material gas. The concentration of nitrogen in material gas shall be less than 1000ppm ($10^{-5}$). Namely, this invention proposes a vapor phase synthesizing method of diamond comprising the steps of mixing a hydrocarbon gas, halogen gas or halogenized hydrocarbon gas and if necessary, a dopant gas, making a material gas by diluting the mixture gas with hydrogen gas or rare gas, introducing the material gas into a vacuum chamber, dissolving the material gas by electric discharge or heat, and synthesizing a diamond film in the vapor phase on a substrate body heated at 250° C. to 700° C. characterized in that the concentration of nitrogen in the material gas is less than 1000 ppm.

Nitrogen gas has never been added to material gas of diamond CVD synthesis intentionally. Nitride has also never been added by intention to material gas. However, nitrogen gas is likely to be included in gas cylinders of rare gases or in gas cylinders of hydrogen gas. Here, rare gases mean argon, neon, helium, krypton and xenon. Gas cylinders of hydrocarbon gas are also likely to include nitrogen gas as impurity. Nitrogen gas has been deemed to be an inactive, inert, stable gas as well as argon, helium or other rare gases so far. People believed that nitrogen gas would not react chemically even at high temperatures and under high pressure in which most materials become active and radical. "Inactive nitrogen gas" or "inert nitrogen gas" may have been a dogma for most physicists or chemists. For example, an LEC (liquid encapsulated Czochralski) method grows a GaAs monocrystal from a GaAs melt under high pressure of nitrogen gas for preventing the GaAs melt from dissolving into arsenic gas. Nitrogen gas does not react with the GaAs melt or GaAs crystal chemically under the high pressure of tens of bars (MPa) at the high temperature of about 1200° C.

Owing to the ordinary idea of inactivity of nitrogen, nobody has noticed that nitrogen would affect the growth of diamond films, if gas cylinders include nitrogen gas as impurity.

Researchers have previously recognized the effects of oxygen and hydrogen, but nitrogen has never been recognized as a problem, due to the general belief that it is inert. Thus, little consideration has been paid to the nitrogen included in a hydrogen gas cylinder or hydrocarbon gas cylinder. In addition to the nitrogen which has been included in gas cylinders, nitrogen will intrude into gas pipe lines through leakage at joints or pipes. The gas pipe lines are usually kept under lower pressure than atmospheric pressure. Nitrogen in the air is likely to be absorbed into the gas pipe lines.

Many repetitions of experiments have taught the inventors that the residual nitrogen gas in the reactor will cause the generation of amorphous carbon or graphite at the growth of diamond in vapor phase. The presence of non-diamond impurities is directly related to the presence of nitrogen in the reactor non-diamond ingredients are borne is surely related to the residual nitrogen gas in the reactor. The inventors cannot still understand why nitrogen produces non-diamond ingredients in the vapor phase deposition methods. But they have been already aware of the strong relation between the nitrogen concentration in material gas and the generation of non-diamond ingredients. The inventors have found the fact that if nitrogen Is included in material gas, less than 100 ppm of nitrogen will not hinder the growth of a diamond film of good quality. The lower the nitrogen concentration decreases, the smaller the concentration of non-diamond ingredients in the diamond film. Low nitrogen concentration enables the production of a good diamond film.

Now the fact is called a principle of low nitrogen concentration. The principle can be applied to any CVD methods for synthesizing diamond films: e.g. microwave plasma CVD method, thermal filament CVD method, thermal plasma CVD method, etc. The temperature of a substrate body is 250° C. to 700° C. Of course, if the substrate body is heated above 700° C., all methods can synthesize a diamond film and inclusion of nitrogen lowers the quality of diamond by increasing the concentration of non-diamond ingredients. But since the purpose of this invention is to synthesize diamond films at low temperature by doping of halogen gas, the temperature of substrate bodies should be less than 700° C. Even the method of this invention can synthesize no diamond on the substrate body kept below 250° C. Thus, the range of the temperature of a substrate body is between 250° C. and 700° C.

Hydrocarbon gases include paraffin hydrocarbons which are in general denoted by a molecular formula $C_nH_{2n+2}$, olefin hydrocarbons which are denoted by a molecular formula $C_nH_{2n}$, acetylene hydrocarbons signified by a molecular formula $C_nH_{2n-2}$, and aromatic hydrocarbons e.g. benzene.

Halogen gases include fluorine gas ($F_2$), bromine gas ($Br_2$), chlorine gas ($Cl_2$), halogenized alkyl $C_nH_{2n+1}X$ (X is halogen), $C_nH_{2n}XY$ (X and Y are halogen) and $C_nH_{2n-1}XYZ$ (X, Y and Z are halogen).

The principal of low nitrogen concentration has been discovered by these inventors for the first time. So far the concentration of nitrogen gas has not been monitored in the CVD growth of diamond films. Practical application of the principle of low nitrogen is to provide a CVD apparatus with a device for monitoring the concentration of nitrogen gas In material gas. Gas chromatograph is a pertinent device for monitoring the nitrogen concentration.

The present invention provides a method of low temperature synthesis of diamond wherein nitrogen gas is limited in the material gas in order to synthesize diamond films with high quality without inclusion of non-diamond ingredients; amorphous carbon or graphite. This is the most important matter in this invention. Nobody has noticed the bad effect of impurity nitrogen on the formation of diamond in vapor phase before this invention. The skilled in the art have believed that nitrogen is so inert, inactive and stable that nitrogen would not participate in the vapor phase reaction of formation of diamond nor exert a bad influence upon diamond films. But it is entirely wrong. Existence of nitrogen in material gas has a decisive, critical significance In vapor phase synthesis of diamond. Nitrogen concentration must not surpass 1000 ppm. People should excise caution that nitrogen concentration should be suppressed below 1000 ppm. The nitrogen concentration should be decreased less and less in vapor phase synthesis of diamond. The smaller the nitrogen concentration becomes, the higher the quality of diamond. This invention will also be applicable to such synthesis from the material gas which includes hydrocarbon gases, halogenized hydrocarbon gases, rare gases or dopant gases. The diamond produced by the method of this invention has little inclusion of non-diamond ingredients. The diamond excels in heat conductivity, abrasion resistance, strength, toughness, and optical properties. The method will be able to be applied to various utilities of diamond.

DETAILED DESCRIPTION OF THE EMBODIMENTS

EMBODIMENT ①

Material gas consists of $CH_3F$ (as halogenized alkyl) and hydrogen gas (as a carrier gas). A substrate body is a silicon wafer. A diamond film is grown on the silicon substrate body by a microwave plasma CVD method from a material gas including $CH_3F$ and $H_2$ under the conditions;

$H_2/CH_3F = 100/0.5$

Temperature of silicon substrate: 300° C.

Nitrogen concentration(non-doped): less than 10 ppm The nitrogen concentration In the material gas which flows through a pipe just before the reactor is precisely measured by gas chromatography. Less than 10 ppm of nitrogen is included in gas cylinders from the beginning. Such inclusion of nitrogen would be unavoidable. The diamond film produced by the condition ($C_N = 10$ ppm) is denoted as sample NO. 1.

In order to clarify the effects of nitrogen on diamond films, material gases NO. 2 to NO. 8 with various concentrations of nitrogen are prepared by adding intentionally nitrogen gas to $CH_3F$ and $H_2$. The nitrogen concentration in the material gas is 40 ppm for gas NO.2, 100 ppm for gas NO.3, 200 ppm for gas NO.4, 500 ppm for gas NO.5, 800 ppm for gas NO.6, 1000 ppm for gas NO.7 and 1100 ppm for gas NO. 10. Diamond films NO.2 to NO. 10 are synthesized from the gases NO.2 to NO. 10 under the same conditions ($CH_3/H = 0.5/100$, $Ts = 300°$ C., microwave plasma CVD) as film NO. 1 except nitrogen concentration in material gas.

The diamond films are analyzed on quality by the Raman scattering spectrometry. If the film is diamond, a sharp peak shall appear at the wavenumber $1333 cm^{-1}$ in the Raman scattering spectrograph. If the film is constructed by non-diamond ingredients, a broad, dull peak shall appear at a wide range between the wavenumber $1350 cm^{-1}$ and the wavenumber $1600 cm^{-1}$ in the Raman scattering spectrograph. Therefore, the quality of the diamond films is estimated by the quotient of the height of the broad peak of non-diamond ingredients divided by the height of the sharp peak of diamond. Double round "⊙" denotes a quotient less than 0.1. Single round "○" denotes a quotient between 0.1 and 0.3. "x" denotes a quotient more than 0.3. Table 1 exhibits the nitrogen concentration of the material gas and the estimation of the films of NO. 1 to NO. 8.

TABLE 1

NITROGEN CONCENTRATION IN MATERIAL GASES AND QUALITY OF DIAMOND FILMS
($CH_3F/H_2 = 0.5/100$, $Ts = 300°$ C.)

| SAMPLES NO. | NITROGEN CONCENTRATION IN MATERIAL GASES (ppm) | ESTIMATION OF QUALITY OF FILMS |
|---|---|---|
| 1 | (NON-DOPE) < 10 | ⊙ |
| 2 | 40 | ⊙ |
| 3 | 100 | ⊙ |
| 4 | 200 | ⊙ |
| 5 | 500 | ○ |
| 6 | 800 | ○ |
| 7 | 1000 | ○ |
| 8 | 1100 | x |

The result shows that the increase of nitrogen atoms in the material gas lowers the quality of diamond films. Namely, the higher the nitrogen concentration raises, the more the non-diamond ingredients, e.g. amorphous carbon and graphite increase. When the nitrogen concentration is more than 1000 ppm, the quality of films drastically decreases. Sample NO.8 is not a transparent film but an opaque, blackish film. The default of NO.8 is easily detected even by eye-observation (estimation x).

These results teach us that optimum selection of gases in material gases and optimum adjustment of ratio of gases cannot synthesize diamond of high quality without controlling the concentration of nitrogen.

Similar experiments have been done by replacing $CH_3F$ with $CH_3Cl$, $CH_3Br$ or $CH_3I$ (as hydrocarbon gas (halogenized alkyl)) in material gases. Similarly to the case of $CH_3F$, high nitrogen concentration more than 1000 ppm heightens the non-diamond ingredients and deteriorates the quality of films.

EMBODIMENT ②

Material gas consists of methane ($CH_4$), fluoride ($F_2$) and hydrogen ($H_2$). A diamond film is synthesized by a microwave plasma CVD method under the conditions;

$CH_4/F_2 = 1/0.1$ $(CH_4 + F_2)/H_2 = 0.01$

Temperature of silicon substrate(Ts): 300° C.

Nitrogen concentration(non-doped): less than 10 ppm The ratio of $F_2$ to $CH_4$ is 0.1. The mixture of $CH_4$ and $F_2$ is diluted to 1% by hydrogen gas. The concentration less than 10 ppm is an intrinsic concentration of gas cylinders. The diamond film synthesized from the material gas whose nitrogen concentration is less than 10 ppm is denoted by NO. 9. Hydrocarbon gas is methane and halogen gas is $F_2$ in embodiment ②. $CH_3F$ in embodiment ① has two roles; i.e. hydrocarbon and halogen. $CH_3F$ has been replaced by ($CH_4 + F_2$) in embodiment ②.

In order to investigate the effect of nitrogen on the quality of films, other samples NO. 10 to NO. 14 have been made from various material gases in which nitrogen is intentionally doped. The concentration of nitrogen is 40 ppm for NO. 10, 200 ppm for NO. 11, 500 ppm for NO. 12, 1000 ppm for NO. 13, and 1100 ppm for NO. 14. The quality of films are estimated by Raman scattering spectrometry. Similarly to embodiment ①, the quotients of the height of the broad peak of non-diamond ingredients divided by the height of the sharp peak of diamond in Raman scattering spectrograph are calculated. Double round "⊚" means a small quotient less than 0.1. Single round "◯" means a moderate quotient between 0.1 and 0.3. "x" means a big quotient more than 0.3. Table 2 shows the relation between the nitrogen concentration and the quality of films.

TABLE 2

NITROGEN CONCENTRATION AND QUALITY OF FILMS MADE FROM $F_2/CH_4 = 0.1/1$, $(CH_4 + F_2)/H_2 = 0.01$

| SAMPLES NO. | NITROGEN CONCENTRATION IN MATERIAL GASES (ppm) | ESTIMATION OF QUALITY OF FILMS |
|---|---|---|
| 9 | (NON-DOPE) < 10 | ⊚ |
| 10 | 40 | ⊚ |
| 11 | 200 | ⊚ |
| 12 | 500 | ◯ |
| 13 | 1000 | ◯ |
| 14 | 1100 | x |

Like embodiment ①, the higher the nitrogen concentration in material gas increases, the lower the quality of films is. When the nitrogen concentration is higher than 1000 ppm in the material gas, the quality of films fatally declines. The film becomes opaque, blackish. The decline of quality is obvious even for eye-observation (NO. 14).

Similar results are obtained by replacing methane ($CH_4$) by ethane ($C_2H_6$), ethylene ($C_2H_4$), acetylene ($C_2H_2$), benzene ($C_6H_6$), etc. High concentration of nitrogen more than 1000 ppm always deteriorates the quality of films, regardless of the kind of hydrocarbon gas.

EMBODIMENT ③

Material gas consists of $H_2$, $CHF_3$ and Ar. A diamond film is synthesized on a silicon substrate heated at 300° C. by a microwave plasma CVD method under the conditions;

$H_2$: $CHF_3$: Ar = 100:0.3:50

Temperature of silicon substrate: 300° C.
Nitrogen concentration: less than 10 ppm
This diamond film is denoted by sample NO. 15. In order to investigate the effects of nitrogen, various material gases with different nitrogen concentration are prepared. Films NO. 16 to 20 are synthesized from the material gases. The nitrogen concentration is 40 ppm for gas NO. 16, 200 ppm for gas NO. 17, 500 ppm for gas NO. 18, 1000 ppm for gas NO.19 and 1100 ppm for gas NO. 20. The quality of films is also estimated by Raman scattering spectrometry. The results are listed in Table 3.

TABLE 3

NITROGEN CONCENTRATION AND QUALITY OF FILMS MADE FROM $H_2$:$CHF_3$:Ar = 100:0.3:50

| SAMPLES NO. | NITROGEN CONCENTRATION IN MATERIAL GASES (ppm) | ESTIMATION OF QUALITY OF FILMS |
|---|---|---|
| 15 | (NON-DOPE) < 10 | ⊚ |
| 16 | 40 | ⊚ |
| 17 | 200 | ⊚ |
| 18 | 500 | ◯ |
| 19 | 1000 | ◯ |
| 20 | 1100 | x |

The definition of ⊚, ◯ and x is the same as embodiment ①. Similarly to embodiments ① and ②, the increase of nitrogen concentration deteriorates the quality of films. Namely, the ratio of amorphous carbon and graphite increases in proportion to the nitrogen concentration in the material gas. In this embodiment, more than 1000 ppm of nitrogen to the whole of the material gas including argon gas makes the film blackish and opaque. Experiments in which argon gas is replaced by helium gas, neon gas, krypton gas or xenon gas give the results similar to Table 3.

EMBODIMENT ④

A diamond film is synthesized on a silicon substrate from a material gas consisting of $CH_2F_2$ and $H_2$ by a microwave plasma CVD method under the conditions;

$CH_2F_2/H_2 = 0.5/100$

Temperature silicon substrate: 300° C.
Nitrogen concentration in total gas: less than 10 ppm
This sample is diamond NO. 21. Less than 10 ppm of nitrogen is intrinsically contained in gas cylinders as impurity. In order to investigate the effect of nitrogen, other diamond films NO. 22 to NO. 28 are grown from material gases which are intentionally doped with nitrogen gas to various concentration. The synthesizing conditions are the same as NO. 20 except the material gas. The quality of the diamond films is also estimated by Raman scattering spectrometry. Table 4 shows the nitrogen concentration and the quality of the films of the samples NO. 20 to NO. 28. The definition of ⊚, ◯ and x are the same as the former embodiments.

TABLE 4

NITROGEN CONCENTRATION AND QUALITY OF FILMS MADE FROM $CH_2F_2/H_2 = 0.5/100$

| SAMPLES NO. | NITROGEN CONCENTRATION IN MATERIAL GASES (ppm) | ESTIMATION OF QUALITY OF FILMS |
|---|---|---|
| 21 | (NON-DOPE) < 10 | ⊚ |
| 22 | 40 | ⊚ |
| 23 | 100 | ⊚ |
| 24 | 200 | ⊚ |
| 25 | 500 | ◯ |
| 26 | 800 | ◯ |
| 27 | 1000 | ◯ |
| 28 | 1100 | x |

EMBODIMENT ⑤

A diamond films is grown on a silicon substrate from material gas consisting of $CF_4$ and $H_2$ by a microwave plasma CVD method under the conditions;

$CF_4/H_2 = 0.5/100$

Temperature of silicon substrate: 300° C.

Nitrogen concentration in total gas: less than 10 ppm
The sample is denoted by NO. 29. In order to investigate the effect of nitrogen in the material gas, other diamond films NO.30 to NO. 34 are grown from material gases which are intentionally doped with nitrogen gas to various concentration. Other conditions except the nitrogen concentration are the same as NO. 29. The quality of the diamond films is also estimated by Raman scattering spectrometry. Table 5 shows the relation between the nitrogen concentration in material gases and the quality of films grown from the material gases.

TABLE 5

NITROGEN CONCENTRATION AND QUALITY OF FILMS MADE FROM $CF_4/H_2 = 0.5/100$

| SAMPLES NO. | NITROGEN CONCENTRATION IN MATERIAL GASES (ppm) | ESTIMATION OF QUALITY OF FILMS |
|---|---|---|
| 29 | (NON-DOPE) < 10 | ⊚ |
| 30 | 40 | ⊚ |
| 31 | 200 | ⊚ |
| 32 | 500 | ○ |
| 33 | 1000 | ○ |
| 34 | 1100 | x |

EMBODIMENT ⑥

Embodiments ① to ⑤ use ultrapure gas cylinders of hydrogen gas and hydrocarbon gas with very little inclusion of nitrogen (less than 10 ppm). But such ultrapure gas is much expensive of course. In industrial scale, cheaper, more easily obtainable gas cylinders shall be used. Ordinary gas cylinders of hydrogen gas or hydrocarbon gases usually contain hundreds to thousands ppm of nitrogen gas as impurity. Therefore, refinement of the ordinary, crude gases is indispensable for carrying out this invention, if the ordinary gas cylinders shall be used.

A diamond film is grown from the material gas prepared from crude gas cylinders put on the market by eliminating nitrogen gas therefrom. Nitrogen is eliminated by making the crude gas pass through fine powder of metal, e.g. titanium (Ti), aluminum (Al) or lithium (Li) filled in a column. The metal powder absorbs nitrogen gas from the crude gas. The gases which have passed though the column have less than 100 ppm of nitrogen. The other conditions are the same as embodiment ①; i.e. 300° C. of substrate temperature, $CH_3F/H_2=0.5/100$ and microwave plasma CVD. The nitrogen concentration of the material gas is monitored by gas-chromatography. The film has good quality ⊙, i.e. the radio of the broad peak of non-diamond ingredients to the sharp peak of diamond in Raman scattering spectrograph is less than 0.1. This result teaches us that even ordinary, crude, cheap gases on the market can be used to synthesize diamond by the pretreatment of eliminating nitrogen. This invention requires less than 1000 ppm of nitrogen concentrate in material gas. Preferably the concentration of nitrogen should be less than 100 ppm in material gas as a whole.

EMBODIMENT ⑦

The influence of nitrogen gas upon the quality of a diamond film depends on the substrate temperature. The lower the substrate temperature is, the stronger the influence of nitrogen gas becomes. When the substrate temperature is 700° C., a material gas including 1000 ppm of nitrogen gas synthesizes diamond of good quality in which the ratio of the non-diamond ingredients to the diamond in the Raman scattering spectroscopy is less than 0.1. When the substrate temperature is 800° C., the diamond synthesized from a material gas including 1000 ppm of nitrogen gas demonstrates ratios between 0.1 and 0.8 in the Raman scattering spectroscopy. The quality of diamond is decreased owing to the inclusion of nitrogen at the low substrate temperature. When the substrate is heated up to 1000° C., even a material gas including 2000 ppm of nitrogen gas can produce diamond of good quality in which the ratio of the Raman scattering spectroscopy is less than 0.1.

What we claim is:

1. A method for low temperature synthesis of diamond from vapor phase comprising the steps of: preparing a material gas consisting of hydrogen gas, carbon and halogen,
   said carbon being hydrocarbon gas or halogenized hydrocarbon gas or a mixture thereof, and
   said halogen being halogen gas or halogenized hydrocarbon gas or a mixture thereof; introducing the material gas into a vacuum chamber, decomposing the material gas by heat, microwave, light or electric discharge and depositing a diamond film on a substrate body heated at 250° C. to 700° C. such that the concentration of nitrogen in the material gas is less than 1000 ppm.

2. A method for low temperature synthesis of diamond from vapor phase comprising the steps of: preparing a material gas by mixing
   i) hydrogen gas, carbon and halogen,
   said carbon being hydrocarbon gas or halogenized hydrocarbon gas or a mixture thereof, and
   said halogen being halogen gas or halogenized hydrocarbon gas or a mixture thereof, with,
   ii) dopant gas of hydrogen gas or rare gas,
   eliminating nitrogen gas from the material gas so that the nitrogen concentration decreases below 1000 ppm,
   introducing the material gas into a vacuum chamber,
   decomposing the material gas by heat, microwave, light or electric discharge, and
   depositing a diamond film on a substrate body heated at 250° C. to 700° C.

3. The method for low temperature synthesis of diamond as claimed in claim (1) or (2), wherein the hydrocarbon gas is paraffine hydrocarbon denoted by a molecular formula $C_nH_{2n+2}$, olefin hydrocarbon denoted by a molecular formula $C_nH_{2n}$, acetylene hydrocarbon denoted by a molecular formula $C_nH_{2n-2}$ or aromatic hydrocarbon.

4. The method for low temperature synthesis of diamond as claimed in claim (3), wherein halogen gas is fluorine gas ($F_2$), bromine gas ($Br_2$) or chlorine gas ($Cl_2$).

5. The method for low temperature synthesis of diamond as claimed in claim (1) or (2), wherein halogenized hydrocarbon is one of halogenized alkyls denoted by molecular formulas $C_nH_{2n+1}X$, $C_nH_{2n}XY$ and $C_2H_{2n-1}XYZ$, where X, Y and Z are halogen.

6. A method for low temperature synthesis of diamond from vapor phase comprising the steps of:
   preparing a material gas by mixing hydrogen gas, carbon and halogen, said carbon being hydrocarbon gas or halogenized hydrocarbon gas or a mixture thereof, and said halogen being halogen gas or halogenized hydrocarbon gas or a mixture thereof, eliminating nitrogen gas from the material gas so that the nitrogen concentration decreases below 1000 ppm, introducing the material gas into a vacuum chamber, decomposing the material gas by heat, microwave, light or electric discharge, and depositing a diamond film on a substrate body heated at 250° C. to 700° C.

7. A method for low temperature synthesis of diamond from vapor phase comprising the steps of:

preparing a material gas consisting essentially of hydrogen gas, carbon and halogen, said carbon being hydrocarbon gas or halogenized hydrocarbon gas or a mixture thereof, and said halogen being halogen gas or halogenized hydrocarbon gas or a mixture thereof, introducing the material gas into a vacuum chamber, and depositing a diamond film on a substrate body, by the chemical vapor deposition method, on a substrate body heated at 250° C. to 700° C.;

such that the concentration of nitrogen in the material gas prior to depositing the diamond film is less than 1000 ppm.

8. A method for low temperature synthesis of diamond from a vapor phase comprising the steps of:

preparing a material gas consisting essentially of hydrogen gas, carbon and halogen, said carbon being hydrocarbon gas or halogenized hydrocarbon gas or a mixture thereof, and said halogen being halogen gas or halogenized hydrocarbon gas or a mixture thereof;

introducing said material gas into a vacuum chamber; and depositing a diamond film on a substrate body, by chemical vapor deposition, on a substrate body;

such that said material gas, prior to depositing said film, has a nitrogen concentration of less than 1000 ppm.

9. The method of claim 8, wherein said substrate body is heated to a temperature in the range of 250° C. to 700° C.

10. The method according to claim 8, wherein said hydrocarbon gas is selected from the group consisting of paraffin gas, olefin gas, acetylene gas, and aromatic hydrocarbon.

11. The method according to claim 8, wherein said halogen gas is selected from the group consisting of fluorine gas, bromine gas, and chlorine gas.

12. The method according to claim 8, wherein said halogenized hydrocarbon gas is a halogenized alkyl gas selected from the group consisting of gases with the molecular formulae $C_nH_{2n+1}X$, $C_nH_{2n}XY$ and $C_2H_{2n-1}XYZ$, where X, Y and Z are halogen.

13. The method according to claim 8, wherein said material gas is further mixed with a dopant gas of hydrogen gas or rare gas.

* * * * *